(12) United States Patent
Maruyama et al.

(10) Patent No.: US 8,339,860 B2
(45) Date of Patent: Dec. 25, 2012

(54) SEMICONDUCTOR MEMORY DEVICE

(75) Inventors: Jumpei Maruyama, Saitama (JP); Sadao Yoshikawa, Yoro-gun (JP)

(73) Assignees: SANYO Electric Co., Ltd., Moriguchi-shi (JP); SANYO Semiconductor Co., Ltd., Gunma (JP)

( * ) Notice: Subject to any disclaimer, the term of this patent is extended or adjusted under 35 U.S.C. 154(b) by 79 days.

(21) Appl. No.: 13/011,629

(22) Filed: Jan. 21, 2011

(65) Prior Publication Data

US 2011/0188316 A1 Aug. 4, 2011

(30) Foreign Application Priority Data

Feb. 1, 2010 (JP) ................................ 2010-020215

(51) Int. Cl.
*G11C 11/34* (2006.01)
*G11C 16/04* (2006.01)

(52) U.S. Cl. ................................ 365/185.21; 365/185.2

(58) Field of Classification Search ............. 365/185.21, 365/185.2

See application file for complete search history.

(56) References Cited

U.S. PATENT DOCUMENTS

| | | | | |
|---|---|---|---|---|
| 4,982,364 | A * | 1/1991 | Iwahashi | 365/185.21 |
| 6,930,922 | B2 * | 8/2005 | Mori et al. | 365/185.2 |
| 7,596,032 | B2 * | 9/2009 | Ogawa et al. | 365/185.21 |
| 2007/0019469 | A1 * | 1/2007 | Motoki | 365/185.03 |

FOREIGN PATENT DOCUMENTS

JP 2008-140431 6/2008

* cited by examiner

*Primary Examiner* — VanThu Nguyen
*Assistant Examiner* — Khamdan Alrobaie
(74) *Attorney, Agent, or Firm* — Morrison & Foerster LLP

(57) ABSTRACT

This invention offers a semiconductor memory device, with which a resolution to read-out data is not reduced even at the time of verify and a stable read-out operation is possible even when a power supply voltage is reduced. A read-out circuit is provided with a current-voltage conversion circuit, that converts a cell current into a data voltage, and a sense amplifier that compares the data voltage with a reference voltage. The current-voltage conversion circuit is formed to include a variable load resistor that is connected to the memory cell through a bit line. The variable load resistor is formed to include P channel type MOS transistors that make load resistors and P channel type MOS transistors that constitute a switching circuit.

7 Claims, 10 Drawing Sheets

SEMICONDUCTOR MEMORY DEVICE

CROSS-REFERENCE OF THE INVENTION

This application claims priority from Japanese Patent Application No. 2010-020215, the content of which is incorporated herein by reference in its entirety.

BACKGROUND OF THE INVENTION

1. Field of the Invention

This invention relates to a semiconductor memory device, specifically to a semiconductor memory device that reads out data stored in a memory cell by comparing a data voltage corresponding to a cell current of the memory cell with a predetermined reference voltage.

2. Description of the Related Art

In recent years, electrically erasable and programmable nonvolatile memories or EEPROMs (Electrically Erasable Programmable Read Only Memories) are widely used in electronic equipment such as mobile phones and digital still cameras. The EEPROM is provided with a memory cell having a floating gate, a source and a drain. It stores binary data or more than two-level data according to whether electric charges are stored in the floating gate or not, and the stored data is read out by sensing a difference in a cell current flowing between the source and the drain, which varies depending on whether the electric charges are stored in the floating gate or not.

In this case, a read-out circuit provided in the EEPROM converts the cell current flowing through the memory cell into a data voltage, and judges the data ("0" or "1") stored in the memory cell by comparing the data voltage with a predetermined reference voltage.

FIG. 9 is a circuit diagram of the read-out circuit in the EEPROM described above. The read-out circuit is composed of a current-voltage conversion circuit 1 (pre-sense amplifier) and a sense amplifier 2 (main sense amplifier). The current-voltage conversion circuit 1 is composed of a P channel type MOS transistor T6 having a source, to which a power supply voltage Vdd is applied, and a gate and a drain connected with each other (diode connection). A drain of a memory cell MC is connected to the drain of T6 through a bit line BL. A source of the memory cell MC is connected to a source line SL, while its gate is connected to a word line WL. A cell current Icell of the memory cell MC flows into the bit line BL, and is converted into a data voltage Vdata by the current-voltage conversion circuit 1.

The sense amplifier 2 is made of a common differential amplifier, and amplifies a difference between the data voltage Vdata and a reference voltage Vref. The sense amplifier 2 is composed of N channel type MOS transistors T1 and T2 that form a differential pair, P channel type MOS transistors T3 and T4 that form a current mirror, each of the MOS transistors T3 and T4 being connected with each of the MOS transistors T1 and T2 respectively, and an N channel type MOS transistor T5 that is connected with a common source of the MOS transistors T1 and T2.

The power supply voltage Vdd is applied to a common source of the MOS transistors T3 and T4. The data voltage Vdata from the current-voltage conversion circuit 1 is applied to a gate of the MOS transistor T1. The reference voltage Vref is applied to a gate of the MOS transistor T2. A sense enable signal SEN is applied to a gate of the MOS transistor T5.

Operations of the read-out circuit are hereafter described referring to FIG. 9 and FIG. 10. In this case, the source line SL is grounded, while a read-out voltage is applied to the bit line BL. When a voltage on the word line WL rises to an H level (Vdd, for example), there flows the cell current Icell that corresponds to the data stored in the memory cell MC. In general, a value of the cell current Icell is in the order of 0 to several tens of microamperes. When the data in the memory cell MC is "0" (programmed state), the value of the cell current Icell is a smaller value (close to a minimum value). When the data in the memory cell MC is "1" (erased state), the value of the cell current Icell is a larger value (close to a maximum value). The current-voltage conversion circuit 1 converts the cell current Icell into the data voltage Vdata.

After that, when the sense enable signal SEN rises to the H level (Vdd, for example), the MOS transistor T5 is turned on to activate the sense amplifier 2. With this, the sense amplifier 2 judges the data ("0" or "1") stored in the memory cell MC by comparing the data voltage Vdata with the reference voltage Vref.

FIG. 10 shows correlations among the data voltage Vdata, the cell current Icell and the reference voltage Vref. The cell current Icell at an intersection of a Vdata-Icell curve and each of the reference voltages Vref1, Vref2 and Vref3 represents corresponding each of threshold cell currents Icell1, Icell2 and Icell3, respectively. That is, the data is judged to be "0" when the cell current Icell of the memory cell is smaller than a set threshold cell current, and the data is judged to be "1" when the cell current Icell is larger than the set threshold cell current.

An input operating voltage range (gate voltage range of the MOS transistors T1 and T2), in which the sense amplifier 2 operates normally, is from a lower limit voltage Vmin to an upper limit voltage Vmax.

In this case, Vmin and Vmax are represented by equations Vmin=Vt(T1)+Vds(T5), and Vmax=Vdd−Vds(T3)+Vt(T1), respectively. Vt(T1) denotes a threshold voltage of the MOS transistors T1 and T2, Vds(T5) denotes a voltage between a source and a drain of the MOS transistor T5, and Vds(T3) denotes a voltage between the source and a drain of the MOS transistor T3 (voltage drop across a diode).

Therefore, it is required that the reference voltage Vref is at least contained within the input operating voltage range. As shown in FIG. 10, the threshold cell current is set at Iref1 in the case of normal read-out, and the reference voltage Vref is accordingly set at Vref1 which is at the center of the input operating voltage range or in the vicinity thereof.

In general, the EEPROM has a function to judge the written-in data, which is referred to as verify. There are two kinds of verify that are erase verify and program verify. The erase verify judges whether the data in the memory cell MC is erased or not, in other words, whether the data stored in the memory cell MC is "1" or not. In this case, the threshold cell current is set to a condition that is severe with the data "1", that is, the threshold cell current is set to Iref1 that is larger than Iref1. The reference voltage Vref is changed accordingly to Vref2 that is lower than Vref1. That is to compensate the operations of the EEPROM, considering variations and a change over time in the cell current Icell.

On the other hand, the program verify judges whether the data "0" is programmed to the memory cell MC correctly or not. In this case, the threshold cell current is set to a condition that is severe with the data "0", that is, the threshold cell current is set to Iref3 that is smaller than Iref1. The reference voltage Vref is changed accordingly to Vref3 that is higher than Vref1.

Technologies mentioned above are disclosed in Japanese Patent Application Publication No. 2008-140431, for example.

As described above, the reference voltage Vref is changed in order to modify the threshold cell current at the time of verify in the conventional read-out circuit. As a result, the reference voltage Vref3 at the time of the program verify approaches the upper limit voltage Vmax of the input operating voltage range of the sense amplifier 2, while the reference voltage Vref2 at the time of the erase verify approaches the lower limit voltage Vmin of the input operating voltage range. Depending on the setting of the threshold cell current, it could happen that the reference voltage Vref2 or Vref3 at the time of verify is not contained within the input operating voltage range. Therefore, there is a possibility that a resolution to read-out the data would be reduced or a malfunction in reading out the data would occur.

Particularly when the power supply voltage Vdd is reduced to about 1.8 V, for example, it is increasingly difficult to contain the reference voltages Vref2 and Vref3 at the time of verify within the input operating voltage range because the input operating voltage range of the sense amplifier 2 becomes so narrow as about 0.8 V-1.6 V.

SUMMARY OF THE INVENTION

The invention provides a semiconductor memory device that includes a bit line and a memory cell connected to the bit line. The memory cell is configured so that data is electrically written-into and read-out from the memory cell and provides the bit line with a cell current corresponding to the data. The memory device also includes a current-voltage conversion circuit converting the cell current flowing through the bit line into a data voltage and having a variable load resistor connected to the memory cell through the bit line. The memory device further includes a sense amplifier comparing the data voltage with a reference voltage.

DETAILED DESCRIPTION OF THE INVENTION

Figure 1:
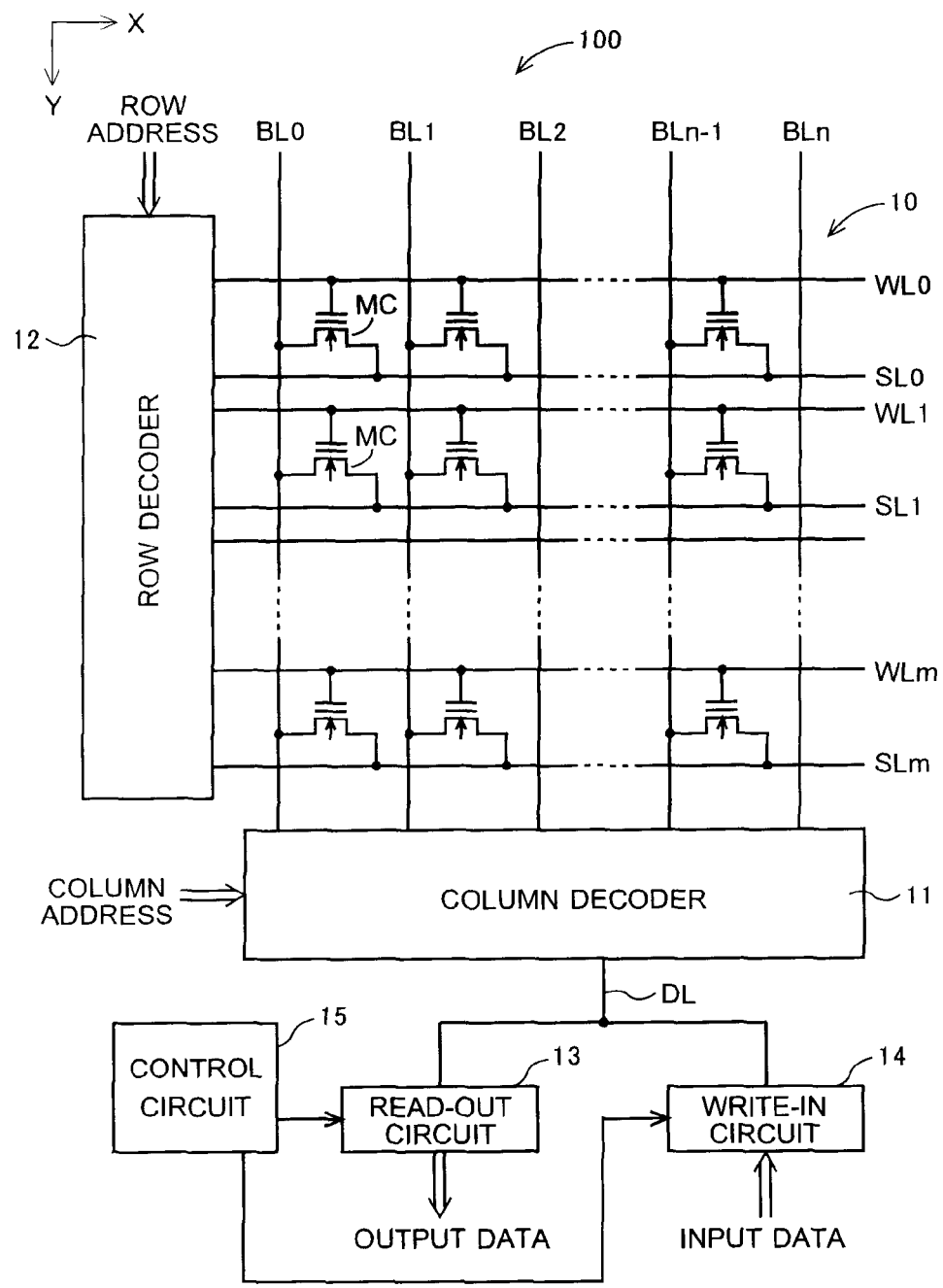
FIG. 1 shows an outline of an overall semiconductor memory device according to a first embodiment of this invention.

A semiconductor memory device 100 according to a first embodiment of this invention will be described referring to the drawings. The semiconductor memory device 100 is a serial input/output type EEPROM in this embodiment.

An overall structure of the semiconductor memory device 100 is hereafter described. FIG. 1 shows an outline of the semiconductor memory device 100. In a memory cell array region 10, a plurality of bit lines BL0-BLn extends in a Y direction, while a plurality of word lines WL0-WLm and a plurality of source lines SL0-SLm extend in an X direction that orthogonally intersects the Y direction, as shown in the drawing. Each of a plurality of memory cells MC is provided corresponding to each of intersections of the plurality of bit lines BL0-BLn and the plurality of word lines WL0-WLm, respectively.

Adjacent the memory cell array region 10, there are provided a column decoder 11 that selects a bit line out of the plurality of bit lines BL0-BLn based on column address signals and a row decoder 12 that selects a word line out of the plurality of word lines WL0-WLm based on row address signals. A memory cell MC is singled out when the column address signals and the row address signals are established.

There is provided a read-out circuit 13 that reads-out data from the memory cell MC, which appears on a bit line BLj selected by the column decoder 11, through a data line DL. In this case, the read-out circuit 13 judges whether the data is "0" or "1" by comparing a stable reference voltage Vref with a data voltage Vdata, that is generated by voltage-conversion of a cell current Icell flowing through the selected memory cell MC.

Also, there is provided a write-in circuit 14 that writes data into the selected memory cell MC through the bit line BLj that is selected by the column decoder 11. In addition, there is provided a control circuit 15 that controls each of write-in and read-out sequences on the memory cell MC based on various kinds of control signals.

Figure 2:
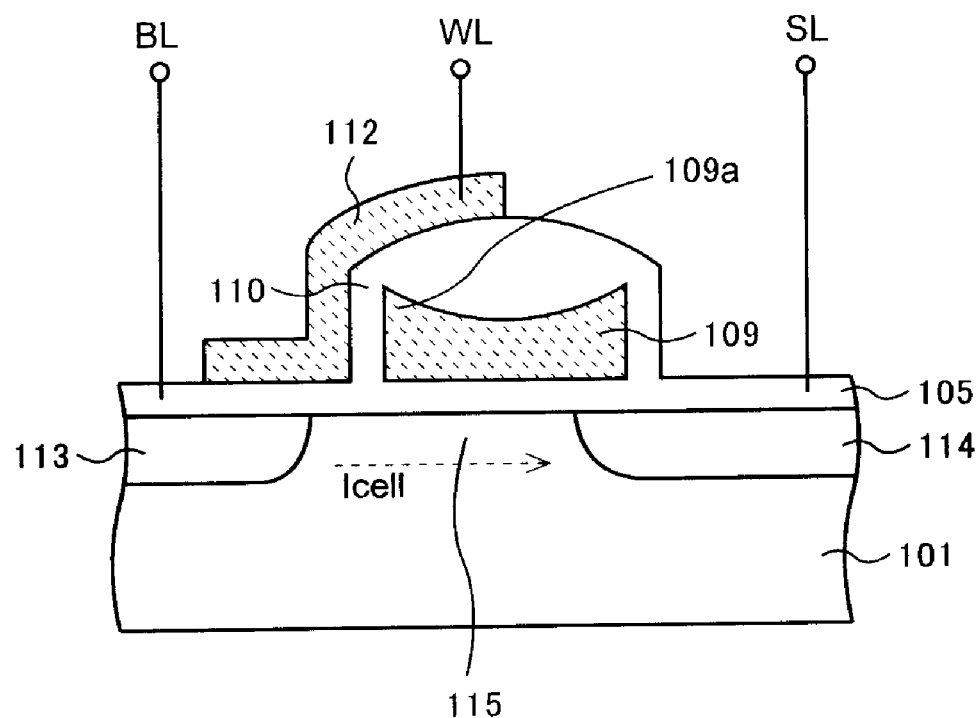
FIG. 2 is a cross-sectional view of a memory cell in the semiconductor memory device according to the first embodiment of this invention.

An example of a concrete structure of the memory cell MC will be described referring to FIG. 2. The memory cell MC is a split-gate type memory cell in which a channel 115 is formed between a drain 113 and a source 114 that are formed in a semiconductor substrate 101 apart from each other at a predetermined spacing. There is formed a floating gate 109 extending from above a part of the channel 115 to above a part of the source 114 through a gate insulation film 105. There is formed a control gate 112 that covers a top surface and a side surface of the floating gate 109 through a tunneling insulation film 110 and extends over a part of the drain 113.

The drain 113 is connected to the corresponding bit line BL, the control gate 112 is connected to the corresponding word line WL, and the source 114 is connected to the corresponding source line SL.

Next, operations of the split-gate type memory cell MC will be described. When data "0" is to be programmed in, a high voltage is applied between the control gate 112 and the source 114 (2 V to the control gate 112 and 12 V to the source 114, for example), and an electric current is fed through the channel 115 so that thermal electrons are injected into and stored in the floating gate 109.

When the programmed "0" is to be erased, in other words, when the data "0" is to be changed to data "1", the drain 113 and the source 114 are grounded and a high voltage (15 V, for example) is applied to the control gate 112 so that the electrons stored in the floating gate 109 are extracted to the control gate 112 as a Fowler-Nordheim tunneling current (hereafter referred to as F-N tunneling current). Since a sharp projection 109a is formed at an upper corner of the floating gate 109, electric field convergence is caused there to make it possible to induce the F-N tunneling current at a lower voltage.

When the data stored in the memory cell MC is to be read-out, predetermined voltages are applied to the control gate 112 and the drain 113 (3 V to the control gate 112 and 1 V to the drain 113, for example). As a result, a cell current Icell, that corresponds to an amount of electric charges of the electrons stored in the floating gate 109, flows between the source 114 and the drain 113. When the stored data is "0", the cell current Icell is reduced because the threshold voltage of the memory cell MC is increased. When the stored data is "1", the cell current Icell is increased because the threshold voltage of the memory cell MC is reduced.

The read-out circuit 13 judges whether the data stored in the memory cell MC is "0" or "1" by converting the cell current Icell into the data voltage Vdata and comparing the data voltage Vdata with the reference voltage Vref.

Next, a structure of the read-out circuit 13, that is one characteristic of this invention, will be described referring to FIG. 3. The read-out circuit 13 is formed to include a current-voltage conversion circuit 20 (pre-sense amplifier), a sense amplifier 30 (main sense amplifier) and an N channel type MOS transistor T20 used to cut off the circuit.

The current-voltage conversion circuit 20 is formed to include P channel type MOS transistors T11, T14 and T17 that make load resistors and P channel type MOS transistors T13, T16 and T19 that constitute a switching circuit.

In this case, the power supply voltage Vdd is applied to a source of the MOS transistor T11. The MOS transistor T11 is connected to a voltage data line 21 through the MOS transistor T13. A gate of the MOS transistor T11 is connected to the voltage data line 21. A load resistor selection signal LOADSEL0 is applied to a gate of the MOS transistor T13. When the load resistor selection signal LOADSEL0 is "1" (H level=Vdd), the MOS transistor T11 is cut off from the voltage data line 21 since the MOS transistor T13 is turned off. When the load resistor selection signal LOADSEL0 is "0" (L level=0 V), the MOS transistor T11 is connected to the voltage data line 21 in the form of diode connection since the MOS transistor T13 is turned on.

Similarly, the power supply voltage Vdd is applied to a source of the MOS transistor T14. The MOS transistor T14 is connected to the voltage data line 21 through the MOS transistor T16. A gate of the MOS transistor T14 is connected to the voltage data line 21. A load resistor selection signal LOADSEL1 is applied to a gate of the MOS transistor T16. When the load resistor selection signal LOADSEL1 is "1" (H level=Vdd), the MOS transistor T14 is cut off from the voltage data line 21. When the load resistor selection signal LOADSEL1 is "0" (L level=0 V), the MOS transistor T14 is connected to the voltage data line 21 in the form of diode connection.

Also, the power supply voltage Vdd is applied to a source of the MOS transistor T17. The MOS transistor T17 is connected to the voltage data line 21 through the MOS transistor T19. A gate of the MOS transistor T17 is connected to the voltage data line 21. A load resistor selection signal LOADSEL2 is applied to a gate of the MOS transistor T19. When the load resistor selection signal LOADSEL2 is "1" (H level=Vdd), the MOS transistor T17 is cut off from the voltage data line 21. When the load resistor selection signal LOADSEL2 is "0" (L level=0 V), the MOS transistor T17 is connected to the voltage data line 21 in the form of diode connection.

That is, since the MOS transistors T11, T14 and T17 in the current-voltage conversion circuit 20 are connected to the voltage data line 21 corresponding to the load resistor selection signals LOADSEL0, LOADSEL1 and LOADSEL2, the current-voltage conversion circuit 20 makes a variable load resistor. To increase a variable range of a resistance of the load resistor, it is preferable that resistances of the MOS transistors T11, T14 and T17 are weighed to have a ratio of 1:1/2:1/4, for example.

A resistance of each of the MOS transistors T11, T14 and T17 is inversely proportional to a ratio of a corresponding channel width to a corresponding channel length. When a channel width of the MOS transistor T11 is represented by W and its channel length is represented by L, the ratio of the channel width to the channel length of the MOS transistor T11 is W/L. It is assumed that the ratio of the channel width to the channel length of the MOS transistor T14 is 2 W/L and that the ratio of the channel width to the channel length of the MOS transistor T17 is 4 W/L. Then, the resistance of the current-voltage conversion circuit 20 can be varied to have seven different values corresponding to the load resistor selection signals LOADSEL0, LOADSEL1 and LOADSEL2.

Assuming the channel lengths of the MOS transistors T11, T14 and T17 are equal to each other, aggregate channel widths of the MOS transistors T11, T14 and T17 in the current-voltage conversion circuit 20 are as shown in Table 1. When LOADSEL0, LOADSEL1, LOADSEL2=<0, 1, 1>, for example, the aggregate channel width is W and the resistance is at its maximum. When LOADSEL0, LOADSEL1, LOADSEL2=<0, 0, 0>, on the other hand, the aggregate channel width is 7 W and the resistance is at its minimum. Note that it is assumed that a resistance of each of the MOS transistors T13, T16 and T19 is negligibly small compared with the resistance of corresponding each of the MOS transistors T11, T14 and T17.

TABLE 1

| LOADSEL0, LOADSEL1, LOADSEL2 | Aggregate Channel Width |
| --- | --- |
| <0, 1, 1> | W |
| <1, 0, 1> | 2 W |
| <0, 0, 1> | 3 W |
| <1, 1, 0> | 4 W |
| <0, 1, 0> | 5 W |
| <1, 0, 0> | 6 W |
| <0, 0, 0> | 7 W |

Figure 3:
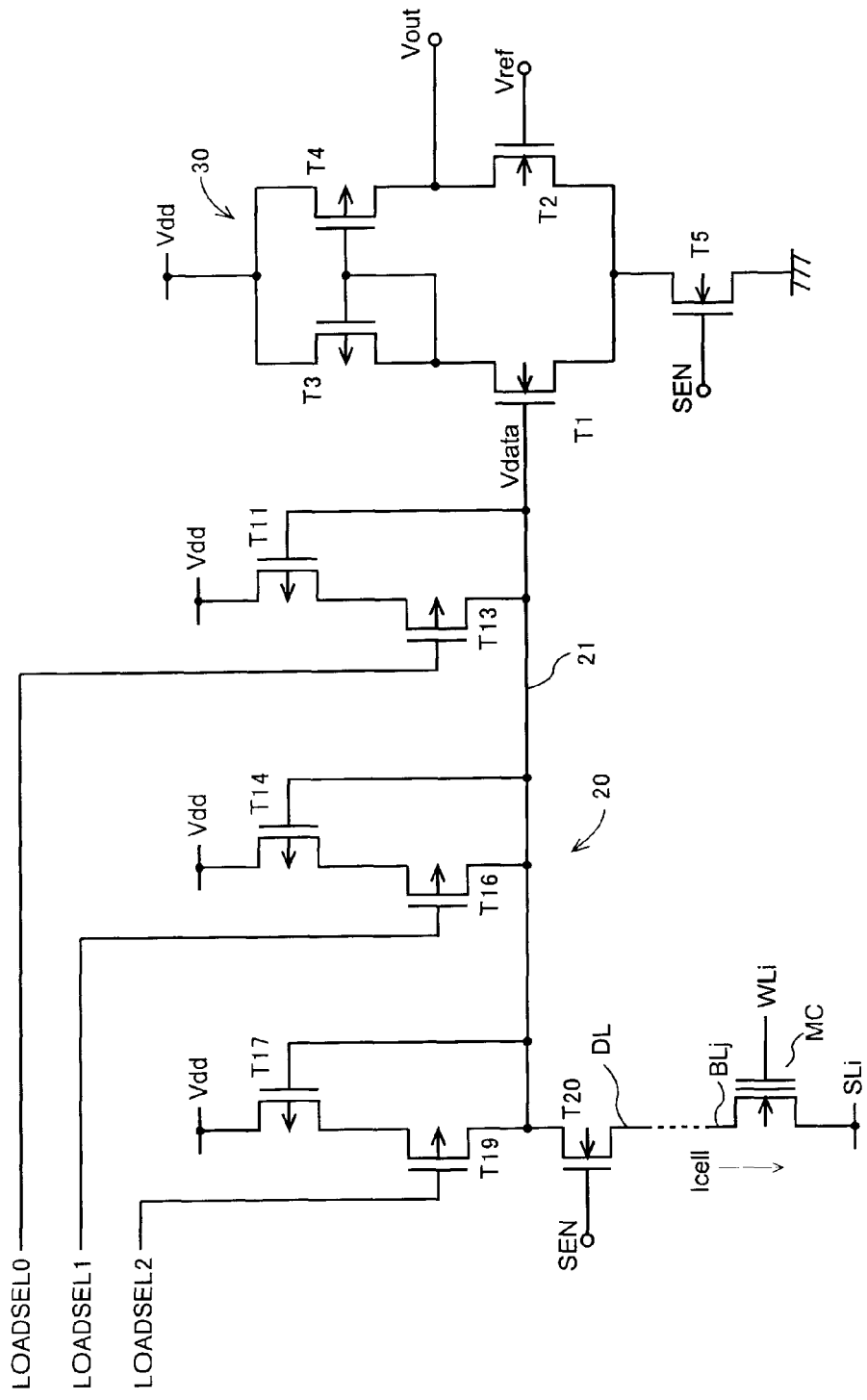
FIG. 3 is a circuit diagram of a read-out circuit in the semiconductor memory device according to the first embodiment of this invention.
Figure 4:
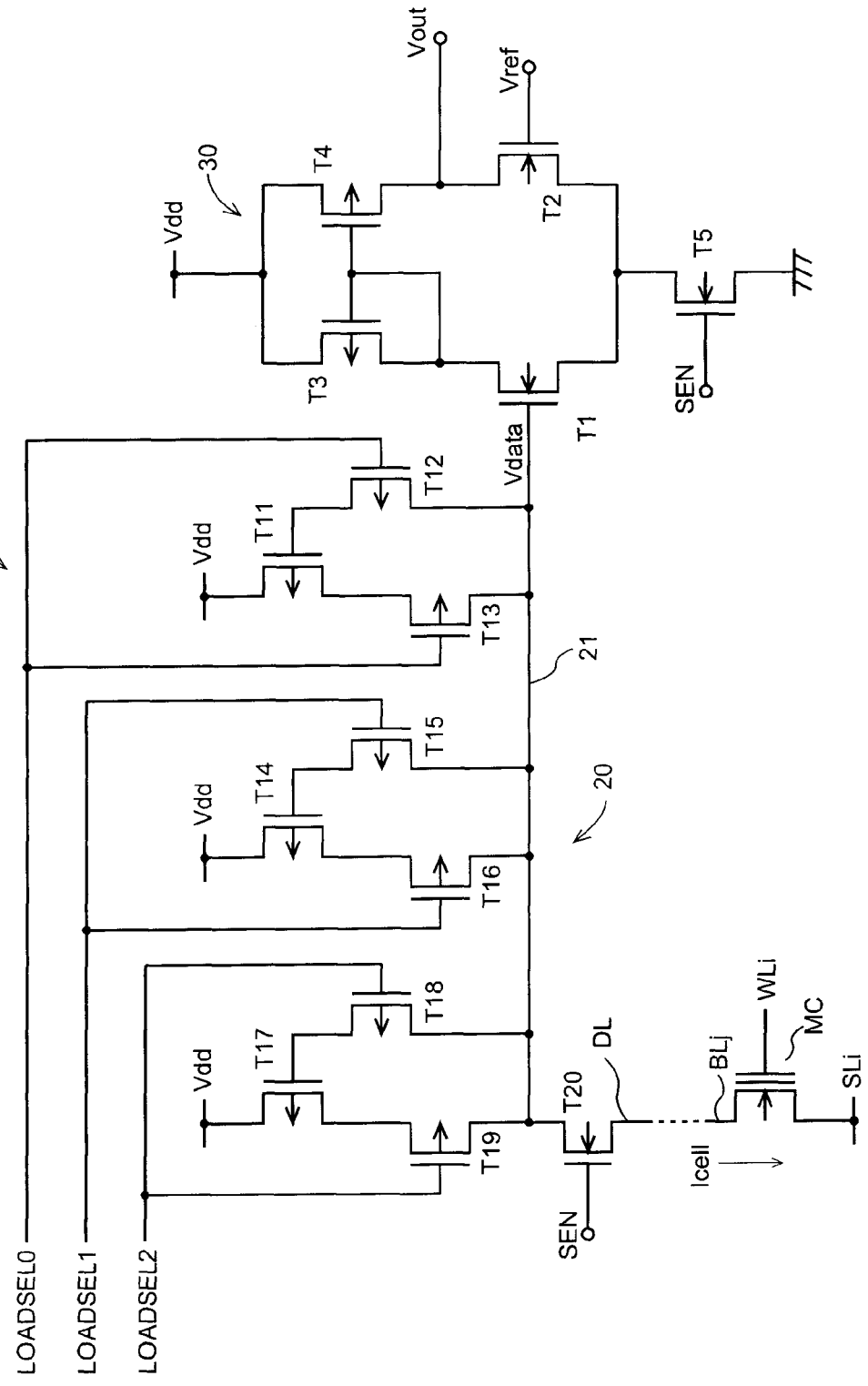
FIG. 4 is a circuit diagram of another read-out circuit in the semiconductor memory device according to the first embodiment of this invention.

As shown in FIG. 4, MOS transistors T12, T15 and T18 may be added to the circuit shown in FIG. 3. In this case, the MOS transistor T12 is connected between the gate of the MOS transistor T11 and the voltage data line 21, and the load resistor selection signal LOADSEL0 is applied to its gate. Similarly, the MOS transistor T15 is connected between the gate of the MOS transistor T14 and the voltage data line 21, and the load resistor selection signal LOADSEL1 is applied to its gate. Similarly, the MOS transistor T18 is connected between the gate of the MOS transistor T17 and the voltage data line 21, and the load resistor selection signal LOADSEL2 is applied to its gate. Each of the MOS transistors T12, T15 and T18 makes switching in the same way as each of the MOS transistors T13, T16 and T19, respectively.

By providing the MOS transistor T12 as described above, a gate capacitance of the MOS transistor T11 is prevented from being connected as a load capacitance to the bit line BLj to reduce read-out speed when the MOS transistor T13 is turned off to cut off the MOS transistor T11 from the voltage data line 21. That is, by turning the MOS transistor T12 off, the gate capacitance of the MOS transistor T11 can be electrically cut off from the bit line BLj. The MOS transistors T15 and T18 are provided by the same reason as described above.

The MOS transistor T20 used to cut off the circuit is connected between the voltage data line 21 and the data line DL, and a sense enable signal SEN is applied to its gate. The data line DL is connected to the selected bit line BLj through the column decoder 11 shown in FIG. 1. The selected memory cell MC is connected to the bit line BLj.

During read-out operation of the read-out circuit 13, the sense enable signal SEN rises to the H level so that the MOS transistor T20 is turned on to connect the read-out circuit 13 to the data line DL. During write-in operation of the write-in circuit 14, on the other hand, the sense enable signal SEN is at the L level. The MOS transistor T20 is turned off to cut off the read-out circuit 13 from the data line DL.

As a result, the MOS transistors T11, T14 and T17 are selectively connected by the load resistor selection signals LOADSEL0, LOADSEL1 and LOADSEL2 to the memory cell MC as a load resistor through the data line DL and the bit line BLj during the read-out operation of the read-out circuit 13. And the cell current Icell of the memory cell MC is converted into the data voltage Vdate by the current-voltage conversion circuit 20.

Detailed explanation on the sense amplifier 30 is omitted since it has the same structure as the conventional sense amplifier 2. The voltage data Vdata from the current-voltage conversion circuit 20 is applied through the voltage data line 21 to a gate of a MOS transistor T1 that makes one of a differential pair. The reference voltage Vref is applied to a gate of a MOS transistor T2 that makes the other of the differential pair. An output voltage Vout is obtained from a connecting node between the MOS transistor T2 and a MOS transistor T4. That is, the output voltage Vout is at the H level when Vdata>Vref, while the output voltage Vout is at the L level when Vdata<Vref.

Figure 5:
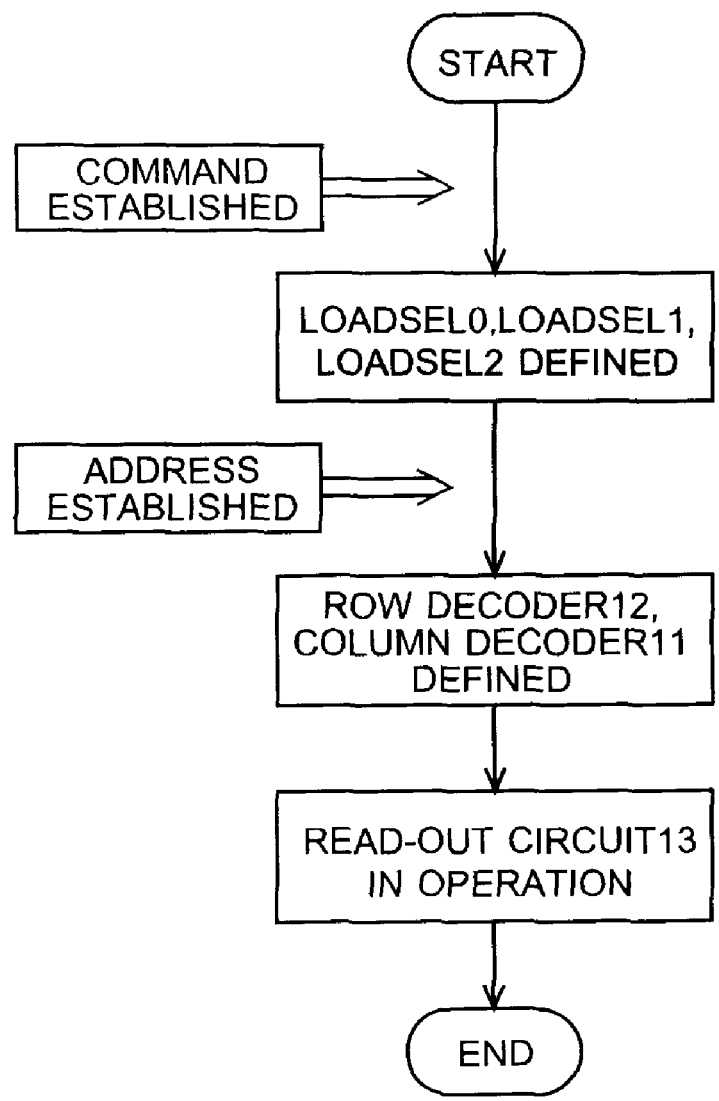
FIG. 5 is a flow chart showing operations of the semiconductor memory device according to the first embodiment of this invention.
Figure 6:
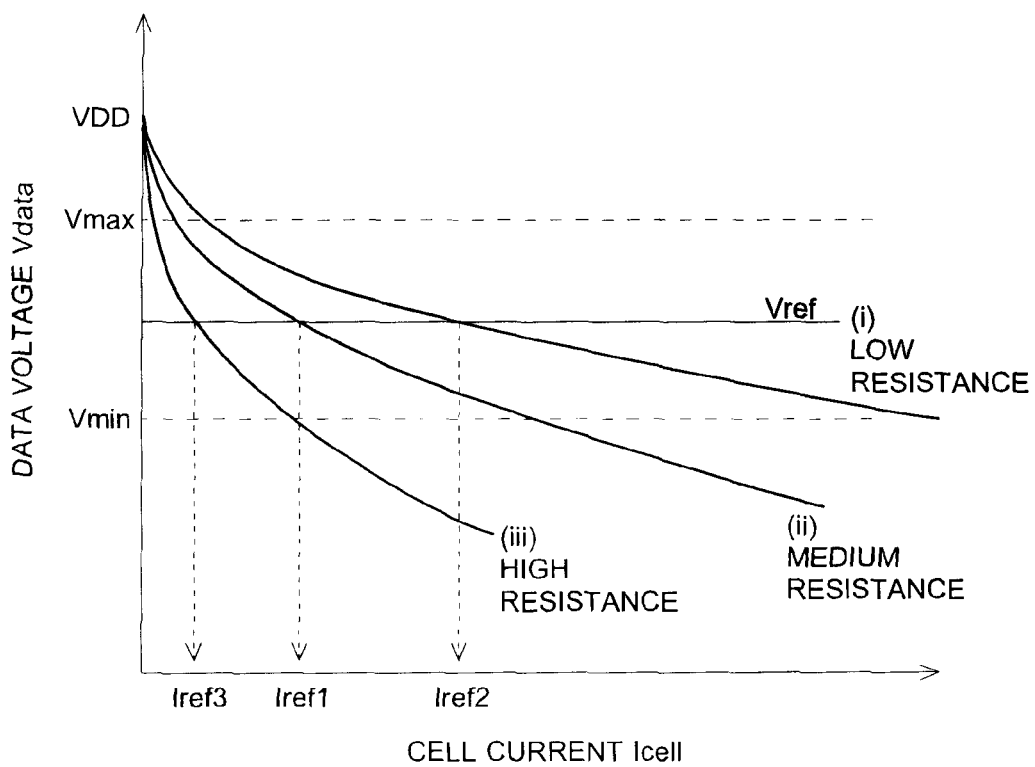
FIG. 6 is to explain characteristics of the read-out circuit in the semiconductor memory device according to the first embodiment of this invention.

Nest, example operations of the read-out circuit 13 are described referring to FIG. 5 and FIG. 6.

First, when a read-out command is established, the load resistor selection signals LOADSEL0, LOADSEL1 and LOADSEL2 are defined based on it. After that, when the row address signals and the column address signals are established, an address selected by the row address decoder 12 and the column address decoder 11 is defined. That is, the bit line BLj is connected to the data line DL, and a word line WLi is set at the H level (read-out voltage level).

Next, when the sense enable signal SEN rises to the H level, the current-voltage conversion circuit 20 in the read-out circuit 13 is connected to the data line DL, and the sense amplifier 30 is put into operation since the MOS transistor T5 is turned on. The sense amplifier 30 compares the reference voltage Vref with the data voltage Vdata from the current-voltage conversion circuit 20, and judges whether the data stored in the memory cell MC is "0" or "1".

FIG. 6 shows correlations among the data voltage Vdata, the cell current Icell and the reference voltage Vref. Each of three Vdata-Icell curves (i), (ii) and (iii) corresponds to each of resistances (low resistance, medium resistance and high resistance) of the current-voltage conversion circuit 20, respectively. The cell current Icell corresponding to each of intersections of the reference voltage Vref and the three Vdata-Icell curves (i), (ii) and (iii) represents each of threshold cell currents Iref2, Iref1 and Iref3, respectively.

The Vdata-Icell curve (i) corresponds to the erase verify that judges whether the data stored in the memory cell MC is "1" or not, and the corresponding threshold cell current Iref2 is set to a condition that is severe with the data "1", that is, Iref2 is set to be larger than Iref1. Therefore, the resistance of the current-voltage conversion circuit 20 is set to the low resistance. The load resistor selection signals LOADSEL0, LOADSEL1 and LOADSEL2 are set to <0, 0, 0> in Table 1, for example, and the aggregate channel width is 7 W in this case. When the cell current Icell of the memory cell MC is smaller than the set threshold cell current Iref2, the data is judged to be "0" (Vout=H) since Vdata>Vref. When the cell current Icell of the memory cell MC is larger than the threshold cell current Iref2, the data is judged to be "1" (Vout=L) since Vdata<Vref.

The Vdata-Icell curve (ii) corresponds to normal read-out, and the threshold cell current is set to Iref1. The resistance of the current-voltage conversion circuit 20 is set to the medium resistance. The load resistor selection signals LOADSEL0, LOADSEL1 and LOADSEL2 are set to <0, 0, 1> in Table 1, for example, and the aggregate channel width is 3 W in this case. The data is judged to be "0" when the cell current Icell of the memory cell MC is smaller than the set threshold cell current Iref1, and the data is judged to be "I" when the cell current Icell is larger than the threshold cell current Iref1.

The Vdata-Icell curve (iii) corresponds to the program verify that judges whether the data "0" is programmed to the memory cell MC correctly, and the corresponding threshold cell current Iref3 is set to a condition that is severe with the data "0", that is, Iref3 is set to be smaller than Iref1. The load resistor selection signals LOADSEL0, LOADSEL1 and LOADSEL2 are set to <1, 0, 1> in Table 1, for example, and the aggregate channel width is 2 W in this case. The data is judged to be "0" when the cell current Icell of the memory cell MC is smaller than the set threshold cell current Iref3, and the data is judged to be "1" when the cell current Icell is larger than the threshold cell current Iref3.

An input operating voltage range (gate voltage range of the MOS transistors T1 and T2), in which the sense amplifier 30 operates normally, is from the lower limit voltage Vmin to the upper limit voltage Vmax as described above. In this case, the reference voltage Vref is set at the center or around the center of the input operating voltage range.

According to the embodiment of this invention, as described above, the threshold cell current at the time of verify is modified not by changing the reference voltage Vref as in the conventional read-out circuit, but by changing the resistance of the current-voltage conversion circuit 20. As a result, the reference voltage Vref can be contained within the input operating voltage range in which the sense amplifier 30 operates normally, and the resolution to read-out the data is not reduced even at the time of verify. Particularly, stable read-out operation is made possible even when the input operating voltage range of the sense amplifier 30 becomes narrow due to the reduction in the power supply voltage Vdd.

Next, a semiconductor memory device 100 according to a second embodiment of this invention will be described referring to the drawings. The semiconductor device 100 differs from the semiconductor device according to the first embodiment in that a structure of a current-voltage conversion circuit 20A in the read-out circuit 13 is different from the structure of the current-voltage conversion circuit 20. The rest of the structures are the same as those in the first embodiment.

Figure 7:
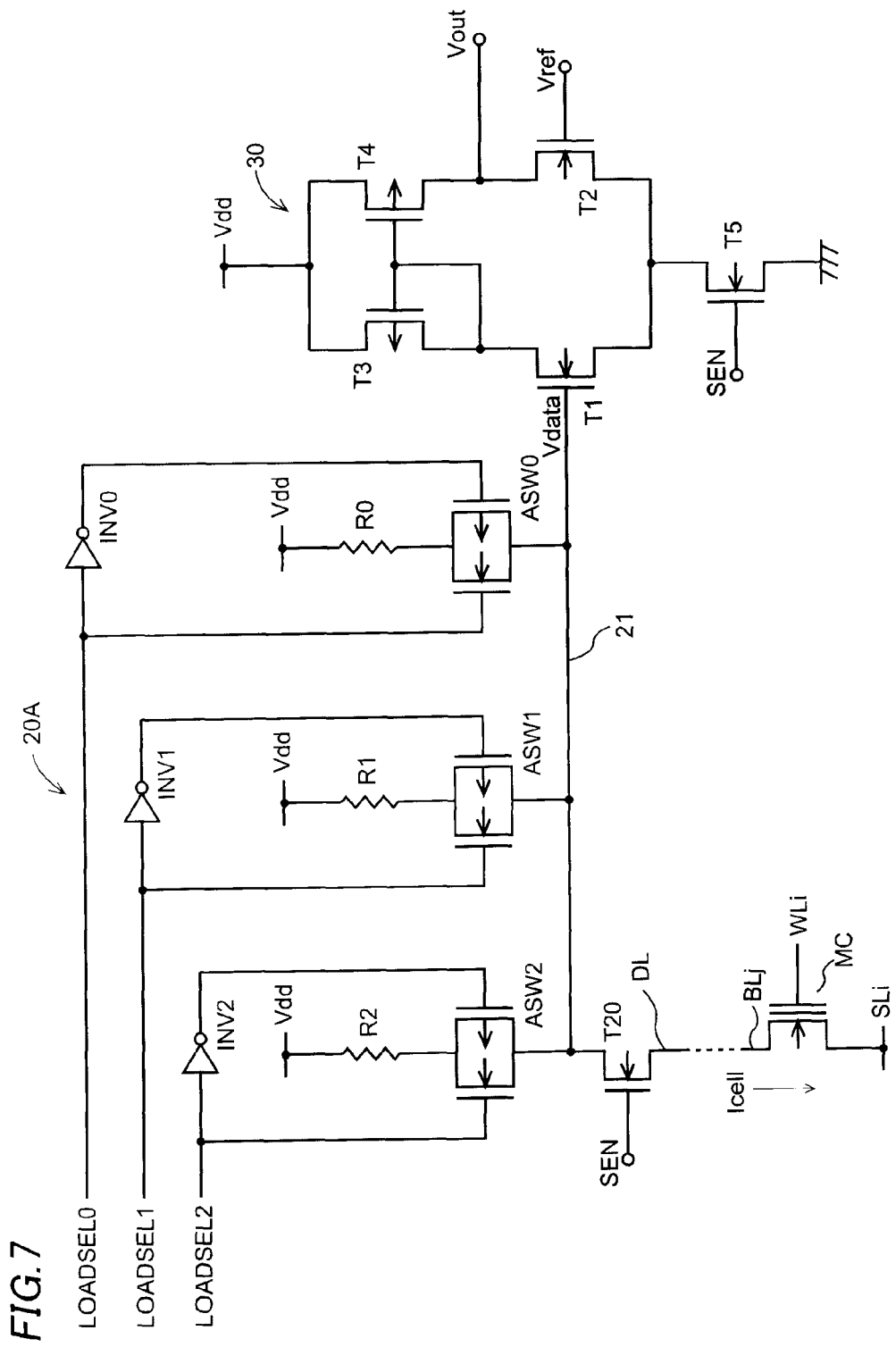
FIG. 7 is a circuit diagram of a read-out circuit in a semiconductor memory device according to a second embodiment of this invention.

FIG. 7 is a circuit diagram of the read-out circuit 13. The current-voltage conversion circuit 20A is formed to include resistors R0, R1 and R2, which make load resistors, and analog switches ASW0, ASW1 and ASW2 and inverters INV0, INV1 and INV2, which constitute a switching circuit. Since other structures of the read-out circuit 13 is the same as those in the first embodiment, explanations on them are omitted.

Each of the resistors R0, R1 and R2 is made of a resistive device having good linearity to the applied voltage (other than a transistor, such as a diffused resistor), and is connected to the voltage data line 21 through corresponding each of the analog switches ASW0, ASW1 and ASW2, respectively. Each of the analog switches ASW0, ASW1 and ASW2 is composed of a P channel type MOS transistor and an N channel type MOS transistor connected in parallel, and has good linearity to the voltage on the voltage data line 21.

The load resistor selection signal LOADSEL0 is applied to a gate of the N channel type MOS transistor in the analog switch ASW0, while a reverse load resistor selection signal *LOADSEL0, that is an inversion of the load resistor selection signal LOADSEL0, is applied to a gate of the P channel type MOS transistor in the analog switch ASW0 through the inverter INV0.

Similarly, the load resistor selection signal LOADSEL1 is applied to a gate of the N channel type MOS transistor in the analog switch ASW1, while a reverse load resistor selection signal *LOADSEL1, that is an inversion of the load resistor selection signal LOADSEL1, is applied to a gate of the P channel type MOS transistor in the analog switch ASW1 through the inverter INV1.

Similarly, the load resistor selection signal LOADSEL2 is applied to a gate of the N channel type MOS transistor in the analog switch ASW2, while a reverse load resistor selection signal *LOADSEL2, that is an inversion of the load resistor selection signal LOADSEL2, is applied to a gate of the P channel type MOS transistor in the analog switch ASW2 through the inverter INV2.

That is, the current-voltage conversion circuit 20A makes a variable load resistor, since the resistors R0, R1 and R2 in the current-voltage conversion circuit 20A are connected or disconnected to the voltage data line 21 in accordance with the load resistor selection signals LOADSEL0, LOADSEL1 and LOADSEL2. To increase a variable range of a resistance of the load resistor, it is preferable that resistances of the resistors R0, R1 and R2 are weighed to have a ratio of 1:1/2:1/4, for example. That is, when the resistance of the resistor R0 is represented by R, the resistance of the resistor R1 is 1/2 R, and the resistance of the resistor R2 is 1/4 R.

Then, the resistance of the current-voltage conversion circuit 20A can be varied to have seven different values corresponding to the load resistor selection signals LOADSEL0, LOADSEL1 and LOADSEL2, as shown in Table 2. Note that it is assumed that an ON resistance of each of the analog switches ASW0, ASW1 and ASW2 is negligibly small compared with the resistance of corresponding each of the resistors R0, R1 and R2.

TABLE 2

| LOADSEL0, LOADSEL1, LOADSEL2 | Resistance |
| --- | --- |
| <1, 0, 0> | R |
| <0, 1, 0> | R/2 |
| <1, 1, 0> | R/3 |
| <0, 0, 1> | R/4 |
| <1, 0, 1> | R/5 |
| <0, 1, 1> | R/6 |
| <1, 1, 1> | R/7 |

Figure 8:
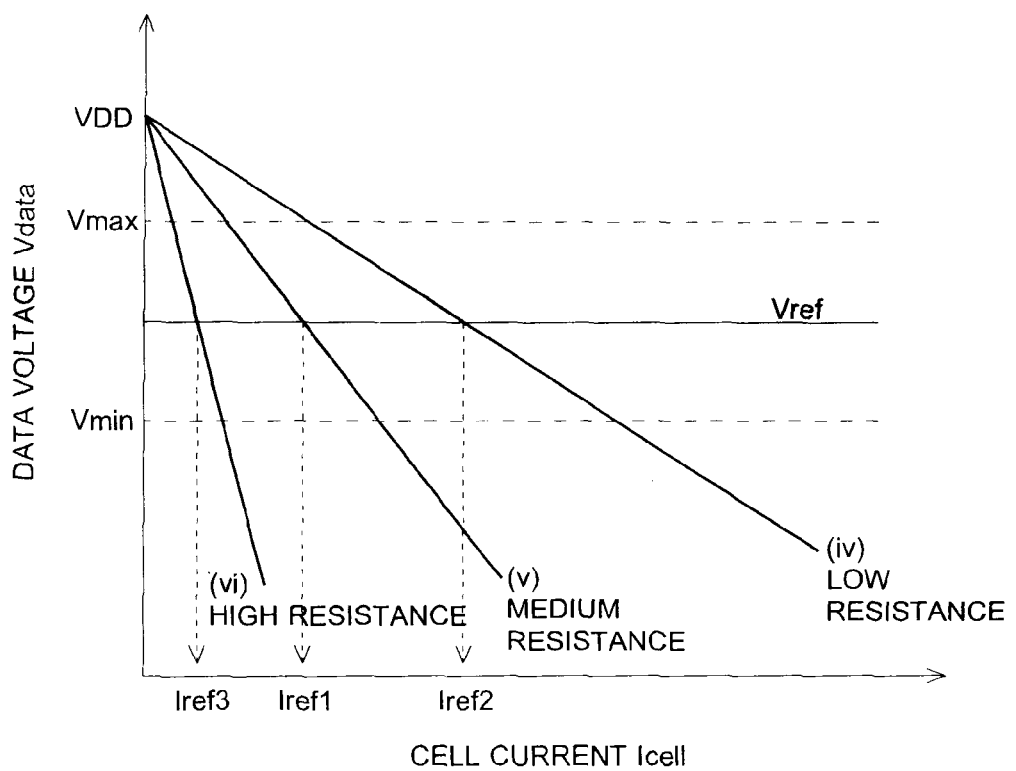
FIG. 8 is to explain characteristics of the read-out circuit in the semiconductor memory device according to the second embodiment of this invention.
Figure 9:
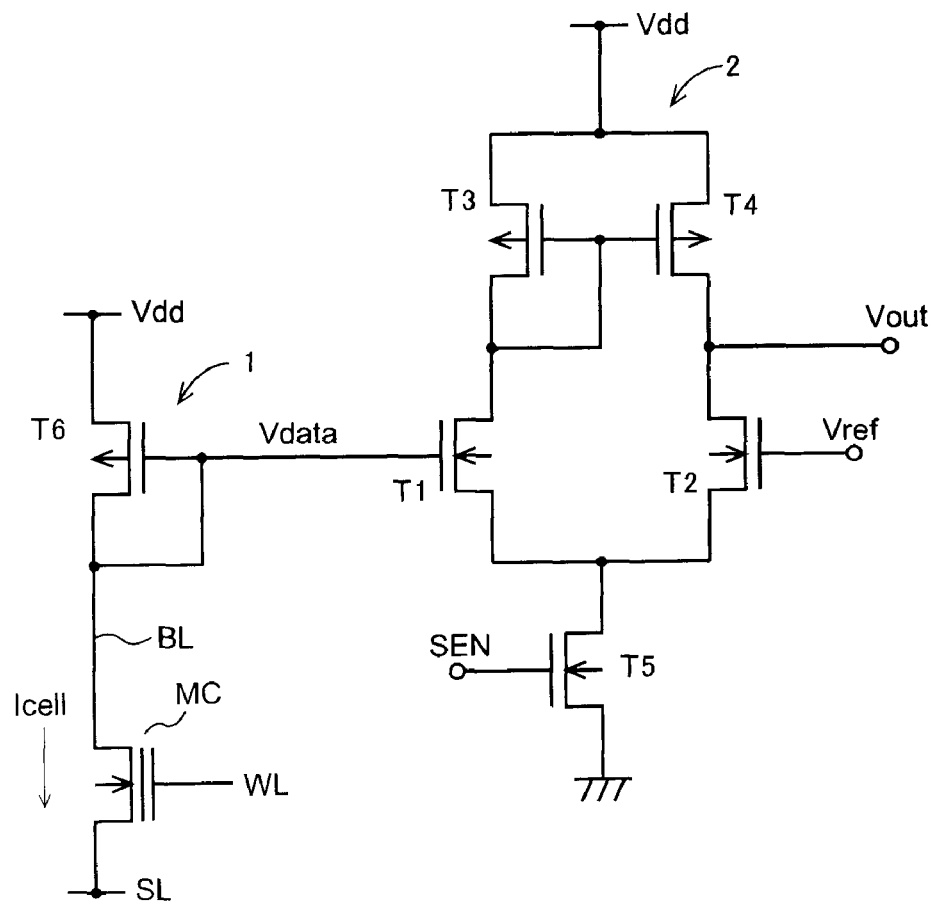
FIG. 9 is a circuit diagram of a read-out circuit in a conventional semiconductor memory device.
Figure 10:
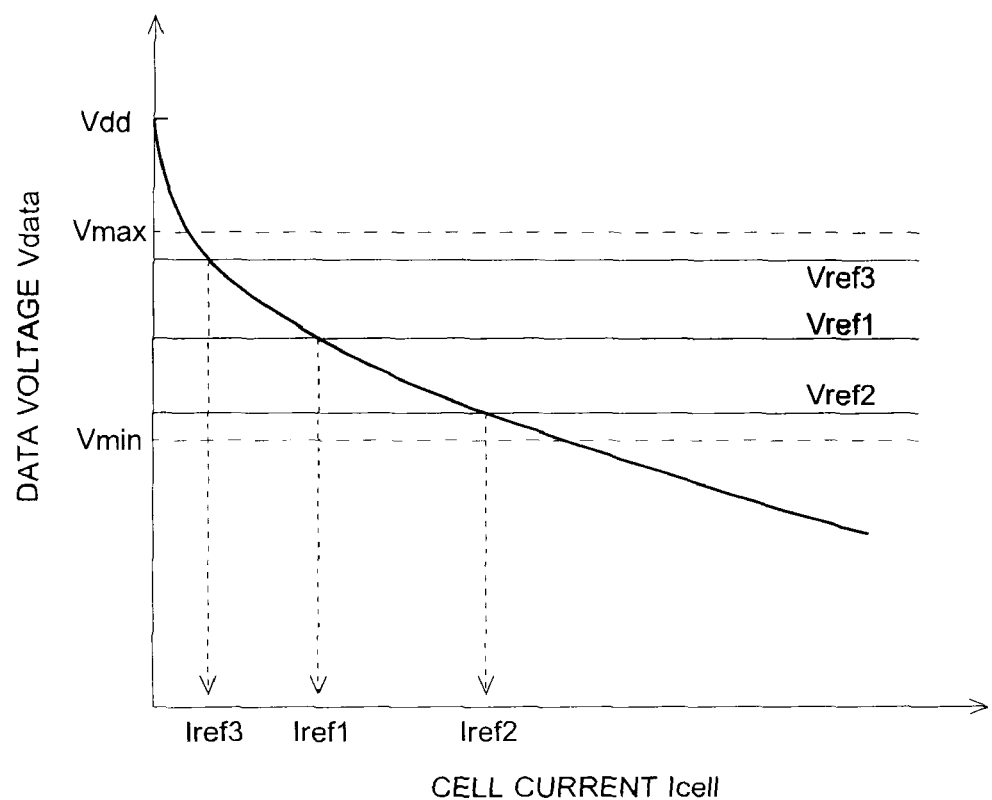
FIG. 10 is to explain characteristics of the read-out circuit in the conventional semiconductor memory device.

FIG. 8 shows correlations among the data voltage Vdata, the cell current Icell and the reference voltage Vref. Similar to those described in the first embodiment, each of three Vdata-Icell curves (iv), (v) and (vi) corresponds to each of resistances (low resistance, medium resistance and high resistance) of the current-voltage conversion circuit 20A, respectively. Because the resistors R0, R1 and R2 are made of the resistive devices having good linearity, each of the three Vdata-Icell curves (iv), (v) and (vi) can be approximated by a straight line.

The cell current Icell corresponding to each of intersections of the reference voltage Vref and the three Vdata-Iceell curves (iv), (v) and (vi) represents each of threshold cell currents Iref2, Iref1 and Iref3, respectively.

The Vdata-Icell curve (iv) corresponds to the erase verify that judges whether the data stored in the memory cell MC is "1" or not, and the corresponding threshold cell current Iref2 is set to a condition that is severe with the data "1", that is, Iref2 is set to be larger than Iref1. Therefore, the resistance of the current-voltage conversion circuit 20A is set to the low resistance. The load resistor selection signals LOADSEL0, LOADSEL1 and LOADSEL2 are set to <1, 1, 1> in Table 2, for example, and the resistance is R/7 in this case. The data is judged to be "0" when the cell current Icell of the memory cell MC is smaller than the set threshold cell current Iref2 because Vdata>Vref, and the data is judged to be "1" when the cell current Icell is larger than the threshold cell current Iref2 because Vdata<Vref.

The Vdata-Icell curve (v) corresponds to normal read-out, and the threshold cell current is set to Iref1. The resistance of the current-voltage conversion circuit 20A is set to the medium resistance. The load resistor selection signals LOADSEL0, LOADSEL1 and LOADSEL2 are set to <1, 1, 0> in Table 2, for example, and the resistance is R/3 in this case. The data is judged to be "0" when the cell current Icell of the memory cell MC is smaller than the set threshold cell current Iref1, and the data is judged to be "1" when the cell current Icell is larger than the threshold cell current Iref1.

The Vdata-Icell curve (vi) corresponds to the program verify that judges whether the data "0" is programmed to the memory cell MC correctly, and the corresponding threshold cell current Iref3 is set to a condition that is severe with the data "0", that is, Iref3 is set to be smaller than Iref1. The resistance of the current-voltage conversion circuit 20A is set to the high resistance. The load resistor selection signals LOADSEL0, LOADSEL1 and LOADSEL2 are set to <0, 1, 0> in Table 2, for example, and the resistance is R/2 in this case.

The data is judged to be "0" when the cell current Icell of the memory cell MC is smaller than the set threshold cell current Iref3, and the data is judged to be "1" when the cell current Icell is larger than the threshold cell current Iref3.

An input operating voltage range (gate voltage range of the MOS transistors T1 and T2), in which the sense amplifier 30 operates normally, is from the lower limit voltage Vmin to the upper limit voltage Vmax, as described above. In this case, the reference voltage Vref is set at the center or around the center of the input operating voltage range.

With the semiconductor memory device according to the second embodiment of this invention, similarly with the first embodiment, there is obtained the effect such that the resolution to read-out the data is not reduced even at the time of verify. In addition, with the semiconductor memory device according to the second embodiment of this invention, a gradient of each of the Vdata-Icell curves (iv), (v) and (vi) in a region around each of the threshold cell currents Iref1, Iref2 and Iref3, respectively, is increased because of the better linearity of the Vdata-Icell curves (iv), (v) and (vi) compared with those in the first embodiment. That is, a rate of a change in the data voltage Vdata to a change in the cell current Icell is increased in this region. As a result, there is obtained a benefit that the resolution against the cell current Icell in this region is improved.

It is apparent that this invention is not limited to the embodiments described above and may be modified within the scope of the invention. For example, the number of the MOS transistors that make the load resistors of the current-voltage conversion circuit 20 (the MOS transistor T11 and the like), or the number of load resistors in the current-voltage conversion circuit 20A (the resistor R0 and the like) is not limited to three, and may be modified as appropriate.

Also, although the serial input/output type EEPROM is described as an example in the first and second embodiments, this invention may be applied to wide variety of memory devices including a parallel input/output type EEPROM and a memory device provided with a memory cell that is electrically programmable and readable, since this invention is characterized by the read-out circuit 13.

Since the current-voltage conversion circuit is formed to include the variable resistor in the semiconductor memory device according to the embodiments of this invention, modifying the resistance of the variable resistor virtually eliminates the need to modify the reference voltage from the center of the input operating voltage range of the sense amplifier, when the threshold cell current is to be modified. With this, the resolution to read-out the data is not reduced even at the time of verify.

Particularly, stable read-out operation is made possible even when the input operating voltage range of the sense amplifier becomes narrow due to the reduction in the power supply voltage.

What is claimed is:

1. A semiconductor memory device comprising:
   a bit line;
   a memory cell connected to the bit line, the memory cell being configured so that data is electrically written-into and read-out from the memory cell and providing the bit line with a cell current corresponding to the data;
   a current-voltage conversion circuit converting the cell current flowing through the bit line into a data voltage and comprising a variable load resistor connected to the memory cell through the bit line; and
   a sense amplifier comparing the data voltage with a reference voltage,
   wherein the variable load resistor comprises a plurality of MOS transistors and a switching circuit that selectively connects at least one of the MOS transistors to the memory cell.

2. The semiconductor memory device of claim 1, wherein the switching circuit comprises a first switching device connected between the bit line and a drain of one of the MOS transistors.

3. The semiconductor memory device of claim 2, wherein the switching circuit further comprises a second switching device connected between the bit line and a gate of the one of the MOS transistors.

4. The semiconductor memory device of claim 1,
   wherein the reference voltage is set at the center or around the center of an input operating voltage range of the sense amplifier.

5. A semiconductor memory device comprising:
   a bit line;
   a memory cell connected to the bit line, the memory cell being configured so that data is electrically written-into and read-out from the memory cell and providing the bit line with a cell current corresponding to the data;
   a current-voltage conversion circuit converting the cell current flowing through the bit line into a data voltage and comprising a variable load resistor connected to the memory cell through the bit line; and
   a sense amplifier comparing the data voltage with a reference voltage,
   wherein the variable load resistor comprises a plurality of resistors and a switching circuit that selectively connects at least one of the resistors to the memory cell.

6. The semiconductor memory device of claim 5, wherein the switching circuit comprises an analog switch connected in series to one of the resistors.

7. A semiconductor memory device comprising:
   a bit line;
   a memory cell connected to the bit line, the memory cell being configured so that data is electrically written-into and read-out from the memory cell and providing the bit line with a cell current corresponding to the data;
   a current-voltage conversion circuit converting the cell current flowing through the bit line into a data voltage and comprising a variable load resistor connected to the memory cell through the bit line; and
   a sense amplifier comparing the data voltage with a reference voltage,
   wherein a resistance of the variable load resistor is configured to be a first resistance at a time of normal read-out and to be a second resistance at a time of verify read-out, the second resistance being different from the first resistance, the verify read-out judging whether the data is written in the memory cell correctly.

* * * * *